United States Patent [19]
Yokota et al.

[11] Patent Number: 6,020,672
[45] Date of Patent: Feb. 1, 2000

[54] SURFACE ACOUSTIC WAVE CONVERTER WITH IMPROVED FREQUENCY CHARACTERISTICS, SURFACE ACOUSTIC WAVE DEVICE USING SUCH CONVERTER, AND COMMUNICATION SYSTEM USING SUCH DEVICE

[75] Inventors: Akane Yokota, Yokohama; Akira Torisawa, Machida; Koichi Egara; Tadashi Eguchi, both of Tokyo; Akihiro Koyama; Takahiro Hachisu, both of Yokohama, all of Japan

[73] Assignee: Canon Kabushiki Kaisha, Tokyo, Japan

[21] Appl. No.: 08/711,000

[22] Filed: Sep. 26, 1996

[30] Foreign Application Priority Data

Sep. 27, 1995 [JP] Japan ..................................... 7-249119
Sep. 20, 1996 [JP] Japan ..................................... 8-250237

[51] Int. Cl.$^7$ .............................. H03H 9/25; H03B 19/00
[52] U.S. Cl. ................................... 310/313 R; 310/313 B
[58] Field of Search ............................. 310/313 R, 313 B

[56] References Cited

U.S. PATENT DOCUMENTS

| | | | |
|---|---|---|---|
| 3,686,518 | 8/1972 | Hartmann et al. ................... | 310/313 R |
| 4,625,207 | 11/1986 | Skeie .................................... | 310/313 B |
| 5,164,628 | 11/1992 | Egara et al. ............................ | 310/313 |
| 5,200,663 | 4/1993 | Mochizuki et al. .................... | 310/313 |
| 5,220,230 | 6/1993 | Niitsuma .............................. | 310/313 R |
| 5,367,216 | 11/1994 | Egara et al. ............................ | 310/313 |
| 5,539,687 | 7/1996 | Torisawa et al. .................... | 310/313 D |

*Primary Examiner*—Thomas M. Dougherty
*Attorney, Agent, or Firm*—Fitzpatrick, Cella, Harper & Scinto

[57] ABSTRACT

A surface acoustic wave converter for converting an electric signal into a surface acoustic wave includes an interdigital transducer provided on a piezoelectric substrate. The interdigital transducer has first and second electrode groups each having one or more electrode fingers to which a first signal is almost simultaneously inputted. The surface acoustic wave converters includes first input unit for inputting the first signal to the one or more electrode fingers of the first electrode group, and second input unit for inputting the first signal to the one or more electrode fingers of the second electrode group when at least one of surface acoustic waves excited by the first signal in the one or more electrode fingers of the first electrode group reaches one of the one or more electrode fingers of the second electrode group.

10 Claims, 8 Drawing Sheets

SURFACE ACOUSTIC WAVE CONVERTER WITH IMPROVED FREQUENCY CHARACTERISTICS, SURFACE ACOUSTIC WAVE DEVICE USING SUCH CONVERTER, AND COMMUNICATION SYSTEM USING SUCH DEVICE

BACKGROUND OF THE INVENTION

1. Field of the Invention

The invention relates to a surface acoustic wave converter for converting an electric signal into a surface acoustic wave. More particularly, the invention relates to a surface acoustic wave converter in which a frequency band limitation is reduced. The invention also relates to a surface acoustic wave converter having a unidirectional performance in which a frequency band limitation can be reduced and an excited surface acoustic wave can be propagated in one direction. The invention also relates to a surface acoustic wave device using those surface acoustic wave converters and to a communication system using such a device.

2. Related Background Art

Figure 7:
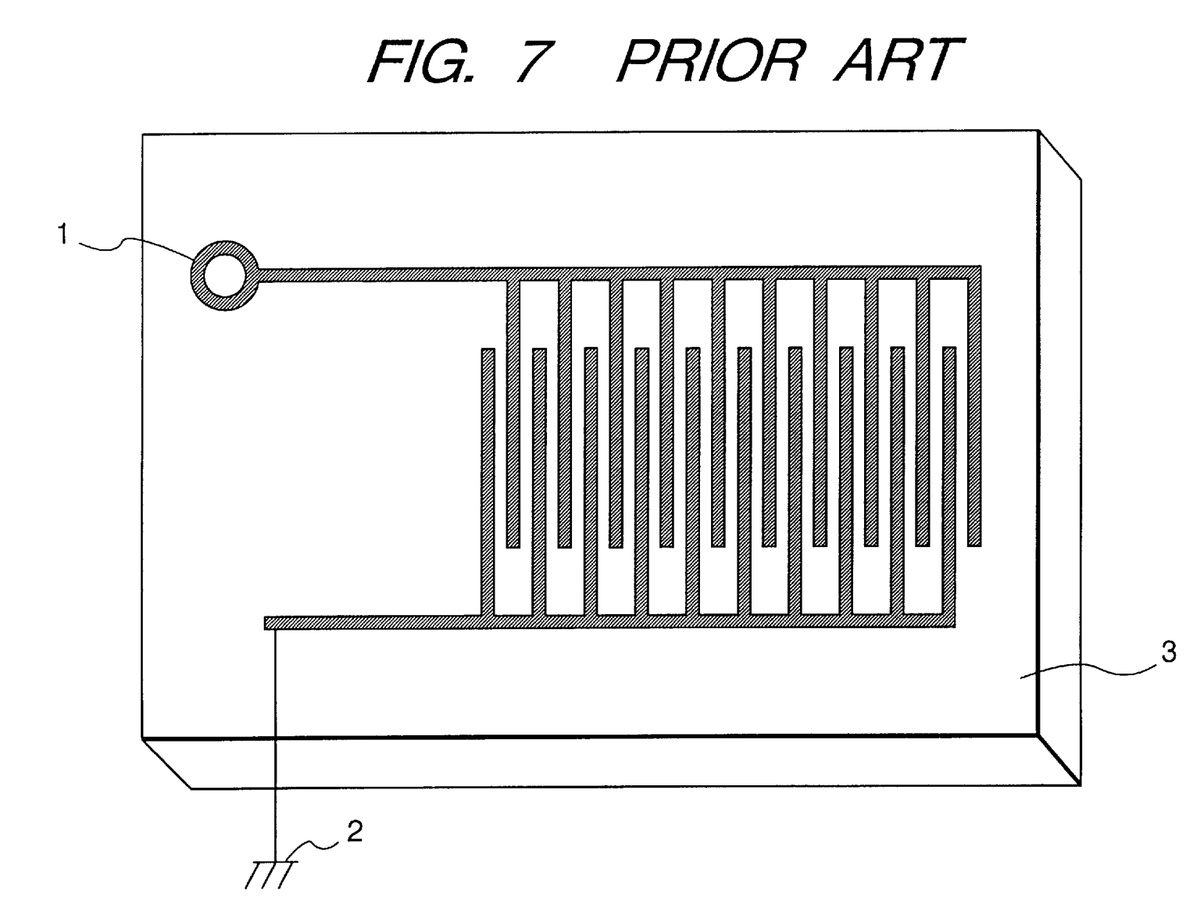
FIG. 7 is a diagram showing a construction of the surface acoustic wave converter of the prior art.

Generally, a surface acoustic wave (SAW) device applies an electric field to an interdigital transducer (IDT) formed on a substrate having a piezoelectric performance made of $LiNbO_3$, $LiTaO_3$, quartz, or the like and executes a signal generation using a piezoelectric effect such that the quartz is deformed or a signal detection using a piezoelectric effect opposite to the above effect. FIG. 7 shows a constructional example of the IDT. In the diagram, reference numeral 1 denotes an input terminal; 2 a ground electrode; and 3 a piezoelectric substrate. As a piezoelectric substrate 3, either a piezoelectric substrate made of a piezoelectric substance or a piezoelectric substrate in which a piezoelectric substance is formed on a non-piezoelectric substrate can be used. A surface acoustic wave is excited by a signal which is inputted from the input terminal 1.

According to the IDT shown in FIG. 7, since the surface acoustic wave progresses in both directions (right direction and left direction in the diagram) of the IDT, in case of a construction using only the surface acoustic wave in one direction, a loss occurs. Therefore, in order to reduce an insertion loss as much as possible in the surface acoustic wave device using the IDT as a converter on the inputting side or a converter on the outputting side, there is a case where a unidirectional converter, a converter having therein a reflector, a reflecting array, or the like is used in the converter on the inputting side or the converter on the outputting side. An example of the unidirectional converter is shown in "The Television", Vol. 30, Section 6, pages 458–459, 1976.

Figure 3:
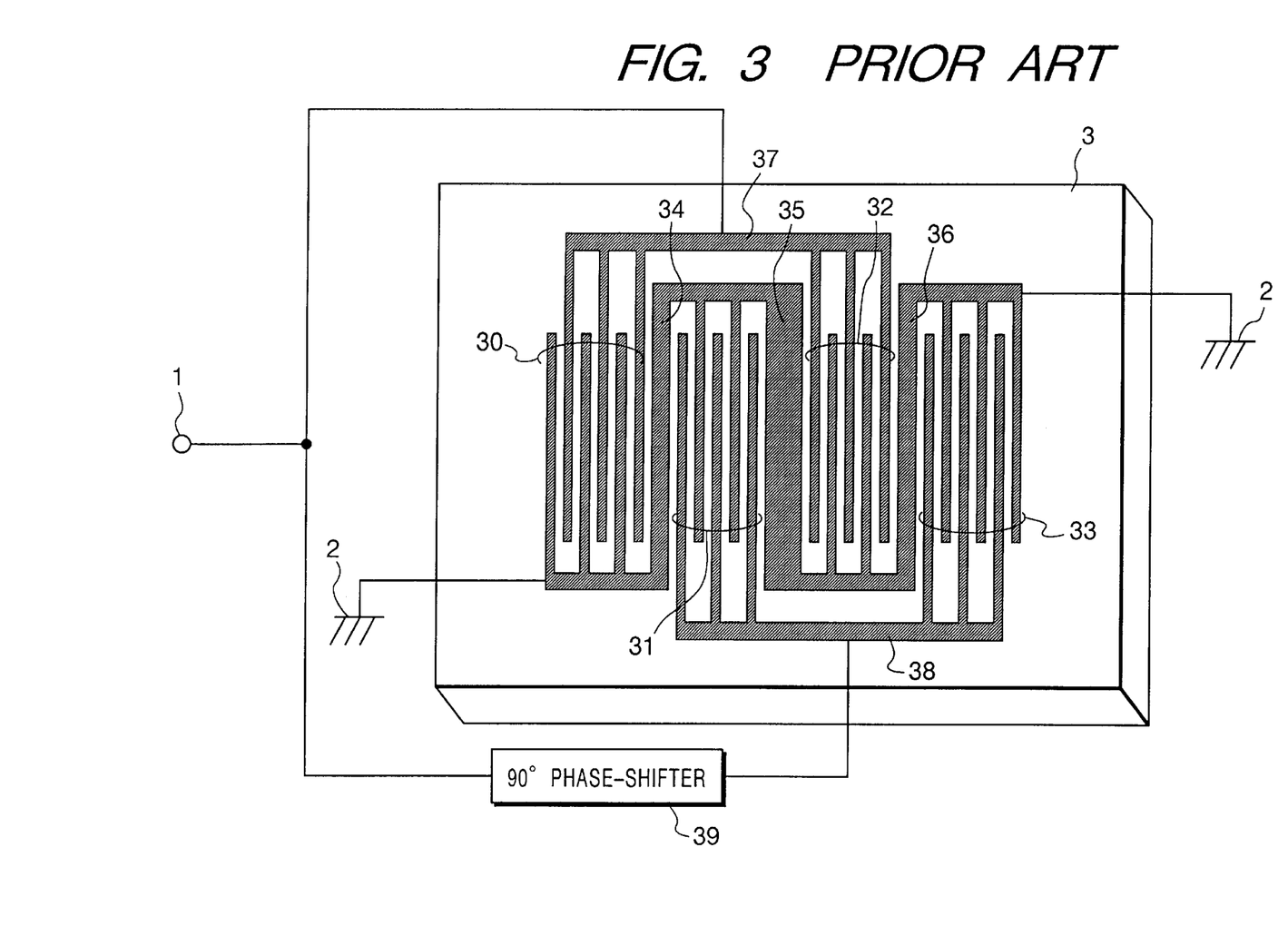
FIG. 3 is a diagram showing a construction of a surface acoustic wave converter of a prior art.

FIG. 3 is a diagram showing an example of a unidirectional converter using a 90° phase-shifter. In the diagram, each of reference numerals 30, 31, 32, and 33 denote an electrode group which includes three electrode fingers to which a signal is inputted and in which a width of each electrode finger and a width of space between the adjacent ground electrodes are equal to $\lambda/4$ ($\lambda$ is a wavelength of a surface acoustic wave at a center operating frequency). Reference numerals 34 and 36 denote ground electrodes each having an electrode width of $\lambda/2$); 35 a ground electrode having an electrode width of $\lambda$; 37 and 38 bus bars connected to the electrode fingers; and 39 a 90° phase-shifter.

In FIG. 3, the signal which is inputted to the electrode groups 31 and 33 from the input terminal 1 through the 90° phase-shifter 39 via the bus bar 38 has a phase difference of 90° with a signal which is inputted to the electrode groups 30 and 32 at a center frequency of the surface acoustic wave that is excited by the IDT. Therefore, as for the surface acoustic wave which progresses to the right in FIG. 3, the phase conditions among the electrode groups are matched. On the other hand, as for the surface acoustic wave which progresses to the left, the phases between the adjacent electrode groups don't coincide. Thus, a unidirectional converter can be realized.

SUMMARY OF THE INVENTION

Generally, in the IDT, since it is necessary to match the phase conditions, a frequency band of the signal is limited.

It is an object of the invention to reduce the limitation of the frequency band in a surface acoustic wave converter. It is, accordingly, another object of the invention to reduce a rounding of a high frequency signal which occurs when a phase modulated signal is used as a signal to be inputted. Still another object of the invention is to provide a surface acoustic wave converter which can reduce a frequency limitation and can also realize a unidirectional performance.

As a result of a vigorous endeavor, the inventors of the present invention have paid attention to a fact that when a surface acoustic wave that is excited in one electrode finger by one input signal (one pulse of the input signal) is defined as a unit surface acoustic wave, such a limitation of the frequency band occurs because a number of unit surface acoustic waves which are simultaneously or almost simultaneously excited by a pulse A as one certain pulse exist, so that they discovered that the band limitation can be reduced by decreasing the number of unit surface acoustic waves.

In the invention, a delay is given to the signal to be inputted in order to reduce the number of unit surface acoustic waves which are excited by one certain pulse. Namely, when a certain pulse A is simultaneously inputted to two (first and second) electrode fingers, the two unit surface acoustic waves corresponding to the pulse A are band limited by an interval between the two electrode fingers. However, by first inputting a certain pulse A to the first electrode finger and, when the first unit surface acoustic wave excited by it reaches another second electrode finger, by inputting the pulse A to the second electrode finger, the first unit surface acoustic wave and the second unit surface acoustic wave can be overlapped without being band limited by the second and first electrode fingers, respectively. When using the phase modulated signal (signal indicative of information by an inversion of the phase) as a signal to be inputted, when considering a case where a certain pulse A is simultaneously inputted to the two (first and second) electrode fingers and, when the first unit surface acoustic wave excited by the pulse A in the first electrode finger reaches the second electrode finger, the pulse B is inputted to the second electrode finger (also inputted to the first electrode finger), if there is a phase inversion between the pulses A and B, the first unit surface acoustic wave disappears in the second electrode finger, so that the signal is rounded. On the other hand, by first inputting a certain pulse A to the first electrode finger and, when the first unit surface acoustic wave excited by it reaches another second electrode finger, by inputting the pulse A to the second electrode finger, one unit surface acoustic wave is excited in the first and second electrode fingers by the same pulse A, so that a rounding of the signal decreases.

A surface acoustic wave converter of the invention is constructed as follows in accordance with the above idea.

A surface acoustic wave converter which is formed on a piezoelectric substrate comprises:

an interdigital transducer, provided on the piezoelectric substrate, for converting an electric signal into a surface acoustic wave, wherein the interdigital transducer has first and second electrode groups each having one or more electrode fingers to which a first signal is almost simultaneously inputted;

first input means for inputting the first signal to the one or more electrode fingers of the first electrode group; and second input means for inputting the first signal to the one or more electrode fingers of the second electrode group when at least one of the surface acoustic waves excited by the first signal in the one or more electrode fingers of the first electrode group reaches one of the one or more electrode fingers of the second electrode group.

Now, assuming that the number of one or more electrode fingers is equal to n and a positional relation of the n electrode fingers in each of the first and second electrode groups is the same, it is sufficient to set so as to satisfy the following conditions.

A distance between the centers of the first and second electrode groups is equal to $m\lambda$. The second input means inputs to the second electrode group the signal that is delayed by a time of kT than the signal inputted to the first electrode group by the first input means.

Where, n: integer of 1 or more m: integer or semi-integer of n or more $\lambda$: wavelength at a center frequency of a surface acoustic wave which is excited by the interdigital transducer k: integer or semi-integer which is equal to or larger than 1 and is equal to or smaller than m T: period at a center frequency of a surface acoustic wave which is excited by the interdigital transducer If the above conditions are satisfied, by further equalizing k to m, when the n unit surface acoustic waves excited in the first electrode group reach n electrode fingers of the second electrode group, the signal corresponding to the n unit surface acoustic waves is inputted to the second electrode group, so that it is most suitable.

To provide a unidirectional performance for the surface acoustic wave converter, by constructing in a manner such that the number of one or more electrode fingers is set to n and the positional relation among the n electrode fingers in each of the first and second electrode groups is made identical and the following conditions are satisfied, the converter can be easily designed and it is suitable.

The distance between the centers of the first and second electrode groups is set to $(m+\frac{1}{4})\lambda$ and the second input means inputs to the second electrode group the signal that is delayed by a time of $(k+\frac{1}{4})$ than the signal inputted to the first electrode group by the first input means.

In this instance as well, it is preferable by equalizing k and m.

It is also possible to set (a) to a natural number, to set the distance between the centers of the electrode groups to $(m+1/a)\lambda$, and to set the delay of signal to $(k+1/a)T$. It is most preferable to set (a) to 4. In the invention, the width of electrode finger, width of space as an interval between the electrode fingers, width of ground electrode, and the like can be properly set so as to satisfy the phase conditions.

The interdigital transducer has a reference electrode to give a reference electric potential to the signal to be inputted. The reference electrode is, for example, a ground electrode. When the number of one or more electrode fingers is equal to 2 or more, the reference electrode is arranged between the two or more electrode fingers or is arranged between the first and second electrode groups. The reference electrode is arranged in a miunderline shape.

As mentioned above, the invention is particularly suitable when converting the phase modulated signal into the surface acoustic wave.

The surface acoustic wave converter of the invention can be applied to various surface acoustic wave devices and good frequency characteristics can be realized. However, in particular, a construction applied to a surface acoustic wave convolver is shown in the embodiment 3 of the invention. When the surface acoustic wave converter of the invention is applied to the surface acoustic wave convolver, it is used as two electrodes for inputting of the surface acoustic wave convolver. In case of the convolver, since its output is proportional to magnitudes of two input signals, when at least one of the two electrodes for inputting has a unidirectional performance, as compared with the case where the electrodes for inputting which do not have the unidirectional performance are used, a double output is derived. If both of the two electrodes for inputting having the unidirectional performance are used, a four-times output will be ideally obtained.

An example in which the surface acoustic wave convolver is used for a synchronization detection of a spread spectrum signal is also shown in the following embodiments.

DETAILED DESCRIPTION OF THE PREFERRED EMBODIMENTS

Embodiments of the invention will now be described in detail hereinbelow with reference to the drawings.

[Embodiment 1]

In the embodiment, an example of a surface acoustic wave converter which can improve frequency characteristics and can realize a unidirectional performance is shown.

Figure 1:
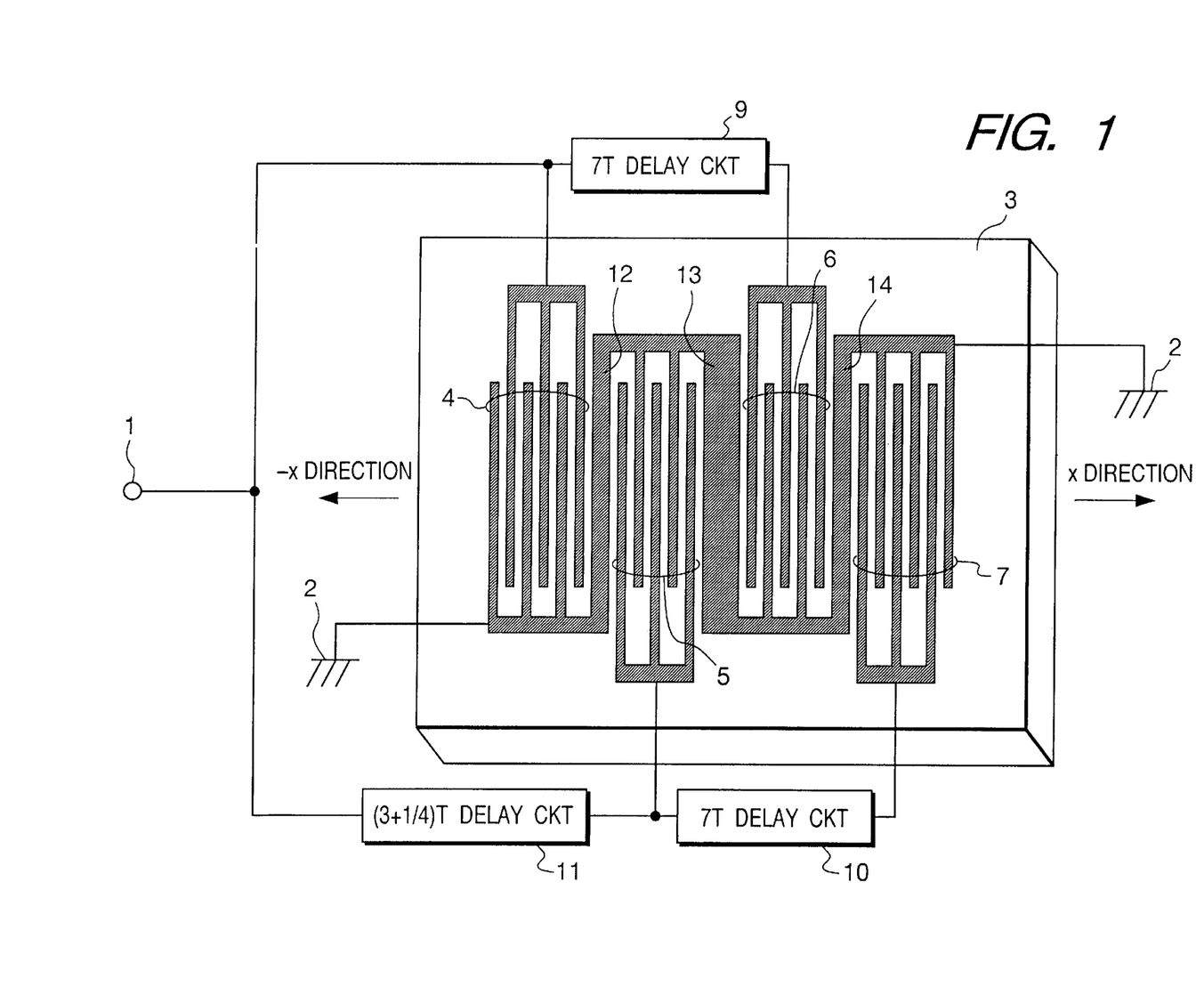
FIG. 1 is a diagram showing a construction of a surface acoustic wave converter of an embodiment 1 according to the invention.

FIG. 1 shows a constructional example of the surface acoustic wave converter according to the embodiment. In FIG. 1, reference numeral 1 denotes the input terminal; 2 the ground terminal to be installed; 3 the piezoelectric substrate made of Y-cut Z-propagation lithium niobate or the like; and 4, 5, and 6 electrode groups. The electrode group is constructed by: n electrode fingers to which a certain one signal (pulse) is almost simultaneously (an ignorable delay due to a difference of signal path lengths or the like in dependence on an electrode pattern, a wiring arrangement, or the like is permitted) inputted; and an electrode (ground electrode) which gives an electric potential as a reference to the signal which is inputted to the electrode fingers. The variable n is an integer of 1 or more. When n is equal to 2 or more due to phase conditions, the n electrode fingers are provided in a manner such that a distance from the center of a certain electrode finger to the center of another electrode finger is equal to a wavelength λ at the center frequency of the surface acoustic wave which is excited by such an interdigital transducer or a value that is integer times as large as the wavelength λ. In the embodiment, n is equal to 3, a width of electrode finger is equal to λ/4, and the ground electrode of a width of λ/4 is provided among the three electrode fingers to which the signal is inputted, respectively. A width of space between the electrode finger and the ground electrode is equal to λ/4.

Reference numerals 12 and 14 denote ground electrodes each having an electrode width of λ/4; 13 a ground electrode having a electrode width of 3λ/4. Those electrodes are arranged in a zigzag miunderline shape. Each of the electrode groups 4 to 7 and ground electrodes 12 to 14 is made of a conductive material such as aluminum or the like and is ordinarily directly formed on the surface of the piezoelectric substrate 3 by using a photolithography technique. As a piezoelectric substrate 3, either a substrate made of a piezoelectric substance itself or a substrate in which a piezoelectric substance is formed on a non-piezoelectric substance can be used.

Reference numerals 9, 10, and 11 denote delay circuits to give a delay to the signal which is inputted to the electrode groups 4 to 7. The delay circuit 11 is a circuit for giving a delay to the signal which is inputted to the electrode group 5 for the signal that is inputted to the electrode group 4. A delay time $(3+¼)T$ (T is a period of a surface acoustic wave at a fundamental frequency) is equal to a time during which the surface acoustic wave propagates by a distance $(3+¼)λ$ between the centers of the electrode groups 4 and 5. A delay time of the delay circuits 9 and 10 is also similarly determined.

Since a structure of the electrodes constructed by the electrode groups 4 and 5 and ground electrode 12 is similar to a structure of the electrodes constructed by the electrode groups 6 and 7 and ground electrode 14, the electrodes constructed by the electrode groups 4 and 5 and ground electrode 12 will now be described as an example.

For convenience of explanation, the direction directing from the electrode group 4 to the electrode group 5 assumes an x direction, the direction directing from the electrode group 5 to the electrode group 4 assumes a −x direction, and a signal f which is inputted to the signal input terminal 1 assumes $$f = \sin \omega t$$

and an explanation will be made hereinbelow. ω denotes an angular frequency of the surface acoustic wave which propagates.

The signal $$f_a = \sin \omega t = f$$

is inputted to the electrode group 4. The signal $$f_b = \sin \omega \{t-(3+¼)\}$$

is inputted to the electrode group 5. Now, assuming that a propagating velocity of the surface acoustic wave is set to v, in the x direction, an amplitude F of surface acoustic wave at a position D that is away from the center of the electrode group 4 by only a distance d in the propagating direction of the surface acoustic wave is $$\begin{aligned} F &= \sin\omega(t - d/v) \\ &\quad + \sin\omega[t - (3 + ¼)T - \{d/v - (3 + ¼)T\}] \\ &= 2\sin\omega(t - d/v) \\ &= 2f \end{aligned}$$

Namely, at the position D, the surface acoustic wave having an amplitude that is twice as large as that of the input signal and a frequency that is equal to a frequency of surface acoustic wave which is excited from one electrode group is observed.

On the other hand, an amplitude F' of surface acoustic wave at a position D' in the −x direction that is away from the center of the electrode group 4 by only a distance d' in the propagating direction of the surface acoustic wave is $$\begin{aligned} F' &= \sin\omega(t + d'/v) \\ &\quad + \sin\omega[t - (3 + ¼)T - \{-d'/v + (3 + ¼)T\}] \\ &= 2\sin\omega\{t + d'/v - (3 + ¼)T\} \\ &\quad \times \cos\omega(3 + ¼)T \end{aligned}$$

In a manner similar to the above, a time delay 7T which is equal to a time during which the surface acoustic wave propagates by a distance 7λ ($λ=v×T$) between the centers of the electrode groups 4 and 6 and be tween the electrode groups 5 and 7 is given to the portion between the electrode groups 4 and 6 and the portion between the electrode groups 5 and 7 by the delay circuits 9 and 10, respectively. Therefore, the surface acoustic waves which are excited by the electrode groups 4 to 7 and propagates in the x direction are enhanced because the phases coincide.

The distance 7λ between the centers of the electrode groups 4 and 6 is obtained by the distance 3λ/2 from the center of the electrode group 4 to the ground electrode 12, width λ/4 of ground electrode 12, space width λ/4, width 3λ of electrode group 5, width 3λ/4 of ground electrode 13, space width λ/4, and distance 3λ/2 from the space to the center of the electrode group 6. The distance between the centers of the electrode groups 5 and 7 is also similarly obtained.

Therefore, the surface acoustic wave of the whole IDT and the surface acoustic wave which propagates in the x direction are enhanced since the phases coincide. Since the frequency characteristics in this instance are equal to the frequency characteristics of the surface acoustic wave which is excited from one electrode group, a good unidirectional performance can be obtained in a wide frequency range.

Although the surface acoustic wave converter using four electrode groups comprising three pairs of electrode fingers has been shown in the embodiment, the number of pairs and the number of electrode groups are not limited to those in the embodiment.

Namely, if the embodiment is generalized, the electrode group comprising the n ($n≧1$) electrode fingers to which the signal is simultaneously supplied in the electrode group is set to a fundamental unit and the electrode groups are arranged so that the distance between the centers of two electrode groups is equal to $(m+\frac{1}{4})\lambda$. ($\lambda$ denotes a wavelength of surface acoustic wave at a fundamental operating frequency, m is set so as to satisfy the relation of $1 \leq n \leq m$). A time delay amount that is equal to a time during which the surface acoustic wave propagates by the distance $(m+\frac{1}{4})\lambda$ between the centers of two electrode groups is given to the electrode groups. In this manner, the embodiment can be generalized.

Double electrodes can be also used as electrode fingers. By setting the electrode fingers to the double electrodes, the reflection of the surface acoustic wave in the electrodes can be reduced. Namely, the n electrode fingers to which the signal is simultaneously supplied in the electrode group include a case where each of the n electrode fingers is constructed by double electrodes.

The piezoelectric substrate which is used in the invention is not limited to $LiNbO_3$ but, for example, a piezoelectric substrate made of $LiTaO_3$, $Bi_{12}SiO_2$, $Bi_{12}GeO_2$, quartz, or the like or a piezoelectric substrate in which a ZnO thin film or the like is formed on a non-piezoelectric substrate can be also used.

In the embodiment, in the electrode group 4 as a first electrode group, when three unit surface acoustic waves A excited in three electric fingers by a certain pulse A reach three electrode fingers of the electrode group 5, the pulse A is inputted to the three electrode fingers of the electrode group 5. In the electrode groups 6 and 7 as well, in a manner similar to the above, by inputting the pulse A to the electrode fingers when the unit surface acoustic waves A reach, three unit surface acoustic waves which are excited by the pulse A in each electrode group overlap. Therefore, a band limitation is similar to a limitation which is subjected by one electrode group.

However, the effect of the invention is not obtained by only the above construction. For example, by constructing such that the pulse A is supplied to the electrode group 5 when one of the three unit surface acoustic waves A excited in the electrode group 4 reaches the electrode finger locating on the most front side of the electrode group 5, one of the unit surface acoustic waves excited by the pulse A in one of the two electrode finger groups and that of the other group overlap. As compared with the case of the prior art, the frequency characteristics can be improved.

The above construction is now generalized as follows.

When the distance between the centers of two electrode groups is equal to $(m+\frac{1}{4})\lambda$, a delay amount of the signal which is supplied to the two electrode groups is equal to $(k+\frac{1}{4})T$, and there is a relation of $1 \leq k \leq m$. Variables m and k are not limited to integers but may be semi-integers.

In the above embodiment, an example in which the electrode groups have the same structure, namely, n electrode fingers in each electrode group are arranged at the same interval has been shown. The invention, however, is not limited to such a structure. That is, in the invention, it is sufficient that phase conditions in each electrode group are satisfied and, when at least one of the unit surface acoustic waves excited in a certain electrode group reaches the electrode fingers of another electrode group, the same :signal as the signal which excited such unit surface acoustic waves is inputted to such an electrode group.

As a delay circuit in the surface acoustic wave converter of the invention, a delay circuit by a surface acoustic wave device is also considered. However, when considering a loss and frequency characteristics, it is suitable to use a delay circuit by a coil.

[Embodiment 2]

In the embodiment 1, a structure of the surface acoustic wave converter having a unidirectional performance has been described as a most preferable example to which the invention is applied. In the embodiment 2, an example of a construction of a surface acoustic wave converter which doesn't have a unidirectional performance is shown.

Figure 8:
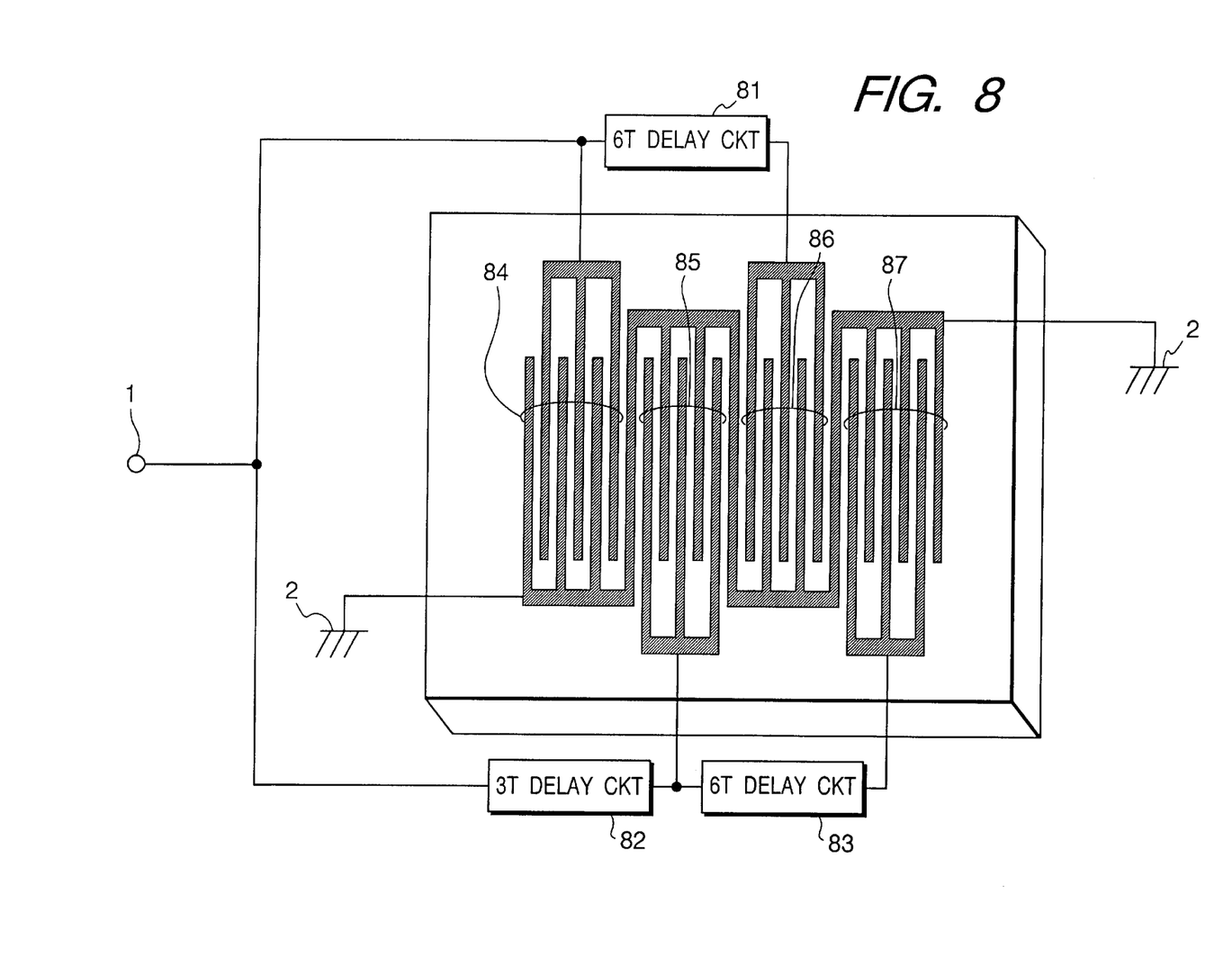
FIG. 8 is a diagram showing a construction of a surface acoustic wave converter of an embodiment 2 according to the invention.

FIG. 8 is a schematic diagram of a surface acoustic wave converter of the embodiment 2. In FIG. 8, reference numerals 84, 85, 86, and 87 denote electrode groups each having three electrode fingers to which a signal is inputted. A width of electrode finger is equal to $\lambda/4$ and ground electrodes each having a width of $\lambda/4$ are provided among three electrode fingers to which the signal is inputted, respectively. A width of space between the electrode finger and the ground electrode is equal to $\lambda/4$. In a manner similar to the embodiment 1, the ground electrodes are arranged in a miunderline shape. As compared with the embodiment 1, according to the embodiment 2, since there is no need to consider a phase difference to give a unidirectional performance, a width of ground electrode between the electrode groups is also set to $\lambda/4$. Reference numerals 81, 82, and 83 denote delay circuits each for giving a delay to the signal that is inputted to each electrode group. In the embodiment, the three unit surface acoustic waves excited by a certain electrode group overlap the three electrode fingers of the adjacent electrode group after the elapse of 3T. In order to give a delay corresponding to 3T, the delay circuit 82 is a 3T delay circuit and the delay circuits 81 and 83 are 6T delay circuits.

The above construction will now be generalized as follows in a manner similar to the embodiment 1.

When the distance between the centers of two electrode groups is equal to $m\lambda$, a delay amount of the signal which is supplied to the two electrode groups is equal to kT and there are relations of $(1 \leq n \leq m)$ and $(1 \leq k \leq m)$. Variables m and k are not limited to integers but may be also semi-integers.

As also described in the embodiment 1, there is no need to use the same construction as a construction of each electrode group. Even when the constructions of the electrode groups differ, there will be no problem so long as each electrode group has a construction such that the phase conditions are satisfied in each electrode group and, when at least one of the unit surface acoustic waves excited in a certain electrode group reaches the electrode fingers of another electrode group, the same signal as the signal which excited the unit surface acoustic waves is inputted to such another electrode group.

[Embodiment 3]

Figure 2:
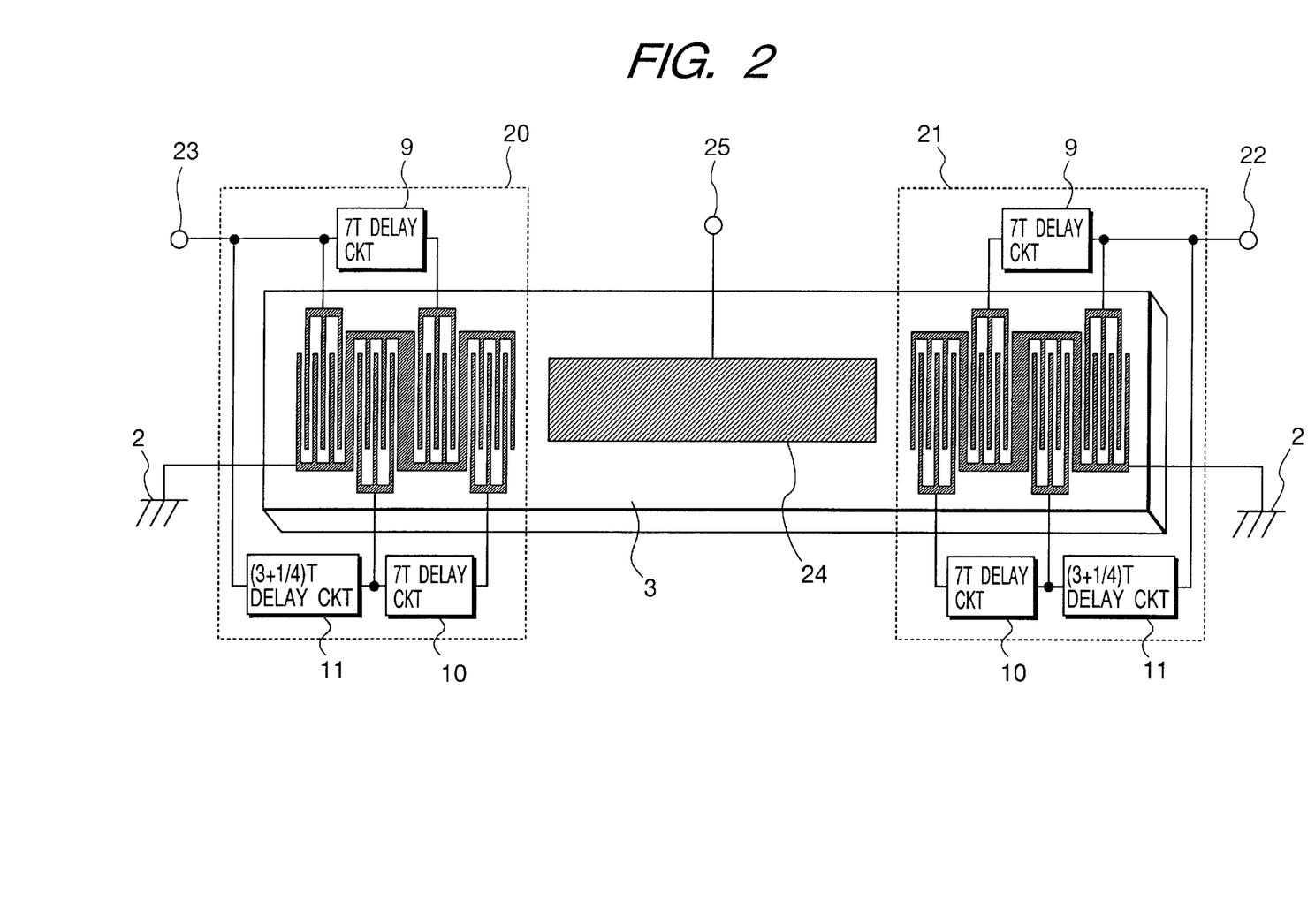
FIG. 2 is a diagram showing a construction of a surface acoustic wave device of an embodiment 3 according to the invention.

FIG. 2 is a schematic diagram showing an example in which the surface acoustic wave converter of the embodiment 1 is applied to a surface acoustic wave convolver as one of the surface acoustic wave devices.

In FIG. 2, reference numerals 20 and 21 denote surface acoustic wave converters according to the invention. Those converters are arranged so that the propagating directions of the surface acoustic waves face each other and are used as electrodes for inputting. Reference numerals 22 and 23 denote signal input terminals; 24 an output electrode; 25 an output terminal; and 3 the piezoelectric substrate made of, for example, Y-cut Z-propagation lithium niobate. Reference numerals 9 and 10 denote the delay circuits of a delay time 7Tc for giving a delay signal to the IDT between the groups; and 11 the delay circuit of a delay time $(3+\frac{1}{4})T$ to give a delay signal to the IDT in the group. Those input and output electrodes are formed by using a metal conductive material such as aluminum or the like and are ordinarily directly formed on the surface of the piezoelectric substrate 3 by using the photolithography technique.

In the surface acoustic wave apparatus with such a construction, an electric signal of a conveying angular frequency ω inputted to the signal input terminals 22 and 23 is converted into the surface acoustic waves by the electrodes 20 and 21 for inputting and propagate in the direction of the output electrode 24, respectively. Since the output electrode 24 functions as a ΔV/V waveguide, the surface acoustic waves propagate on the piezoelectric substrate 3 in the opposite directions in a state in which they are shut in the output electrode 24 (waveguide). The two surface acoustic waves collide on the output electrode 24 and are taken out from the output terminal 25 as a convolution signal of 2ω due to a physical non-linear effect of the piezoelectric substrate 3.

The ΔV/V waveguide reduces a propagating velocity of the surface acoustic waves than that on the free surface by electrically short-circuiting the surface of the substrate, thereby intending to confine the surface acoustic waves into the short-circuit portion.

By using the unidirectional converter for the electrode for inputting, the input electric signal can be efficiently converted into the surface acoustic waves and can be concentrated into the output electrode and a convolution efficiency can be improved.

Further, since the surface acoustic waves which are excited by the unidirectional converter of the invention have frequency characteristics of a wide band, by using the unidirectional converter as an input electrode, a convolver having characteristics of a wide band can be realized.

In the embodiment 3, although the surface acoustic wave converter using four electrode groups each of which is formed with three pairs of electrode fingers has been shown, the number of pairs and the number of electrode groups can be also different from those of the above embodiments. Double electrodes can be also used as electrode fingers. By using the double electrodes as electrode fingers, the reflection of the surface acoustic wave in the electrode can be reduced.

The surface acoustic wave converter can be also constructed by using an almost arc-shaped IDT. By setting the shape of input electrode to an almost arc-shape, the surface acoustic waves excited in the IDT can be efficiently concentrated to the waveguide.

The material of the piezoelectric substrate which is used in the invention is not limited to $LiNbO_3$ (Y-cut Z-propagation lithium niobate) but, for example, a piezoelectric substrate made of $LiTaO_3$, $Bi_{12}SiO_2$, $Bi_{12}GeO_2$, quartz, or the like or a piezoelectric substrate in which a ZnO thin film or the like is formed on a non-piezoelectric substrate can also be used.

[Embodiment 4]

Figure 4:
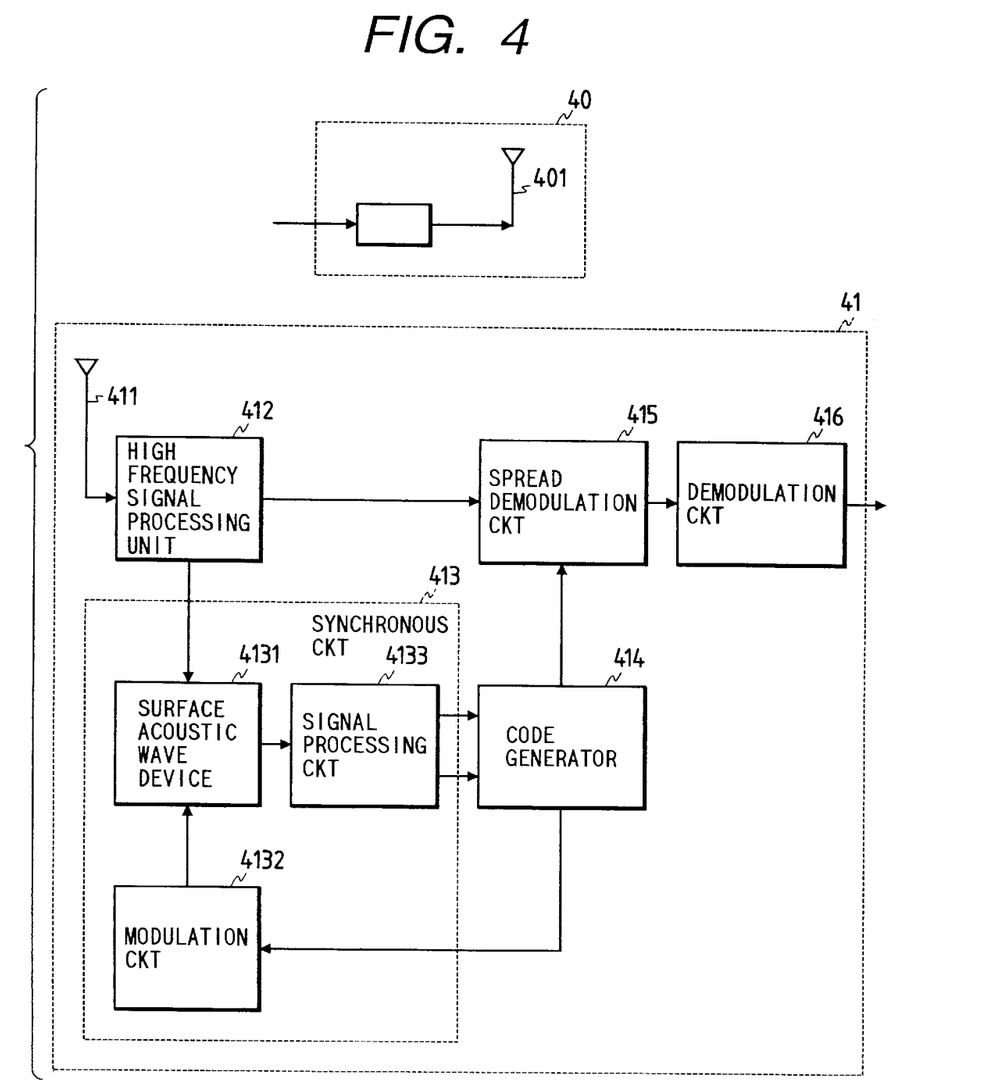
FIG. 4 is a block diagram showing a construction of a communication system of an embodiment 4 according to the invention.

FIG. 4 is a block diagram showing an example of a communication system using a surface acoustic wave converter as described above. In the diagram, reference numeral 40 denotes a transmitter. The transmitter 40 spread spectrum modulates a signal to be transmitted by using a diffusion code and transmits the modulated signal from an antenna 401.

The transmitted signal is received by a receiver 41 and is demodulated. The receiver 41 is constructed by: an antenna 411; a high frequency signal processing unit 412; a synchronous circuit 413; a code generator 414; a spread demodulation circuit 415; and a demodulation circuit 416. The reception signal received by the antenna 411 is properly filtered and amplified by the high frequency signal processing unit 412 and is transmitted as a transmitting frequency signal as it is or is converted into a proper intermediate frequency band signal and is outputted. The output signal is inputted to the synchronous circuit 413. The synchronous circuit 413 is constructed by: a surface acoustic wave device 4131 disclosed in the above embodiments of the invention; a modulation circuit 4132 for modulating a diffusion code for reference inputted from the code generator 414; and a signal processing circuit 4133 for processing the signal outputted from the surface acoustic wave device 4131 and for generating a diffusion code sync signal for the transmission signal and a clock sync signal to the code generator 414.

An output signal from the high frequency signal processing unit 412 and an output signal from the mnodulation circuit 4132 are inputted to the surface acoustic wave device 4131 and a convolution arithmetic operation of two input signals is executed. Now, assuming that the diffusion code for reference that Is inputted from the code generator 414 to the modulation circuit 4132 is a code obtained by time inverting the diffusion code which is transmitted from the transmitting side, when a synchronization exclusive-use diffusion code component and the diffusion code for reference which are included in the reception signal coincide on the waveguide of the surface acoustic wave device 4131, a correlation peak is outputted from the surface acoustic wave device 4131. As a surface acoustic wave device 4131, by using a surface acoustic wave device which is mutually unidirectional and which has been described in the embodiment 2, a signal having a large correlation peak as one of desired signals can be obtained.

In the signal processing circuit 4133, the correlation peak is detected from the signal which is inputted from the surface acoustic wave device 4131, a deviation amount of the code synchronization is calculated from a time required from the start of the reference diffusion code to the generation of the correlation peak, and a code sync signal and a clock signal are outputted to the code generator 414. A synchronization with an output signal from the high frequency signal processing unit 412 is established by the code generator 414, modulation circuit 4132, surface acoustic wave device 4131, and signal processing circuit 4133 constructing what is called a PLL loop. After the synchronization was established, the code generator 414 generates a diffusion code in which the clock and diffusion code phase coincide with those of the diffusion code on the transmitting side.

The diffusion code is inputted to the spread demodulation circuit 415 and the signal before it is spread modulated is reconstructed on the transmitting side. A signal which is outputted from the spread demodulation circuit 415 is a signal modulated by a modulating method such as what is called a frequency modulation, phase modulation, or the like and is data modulated by the demodulation circuit 416.

[Embodiment 5]

Figure 5:
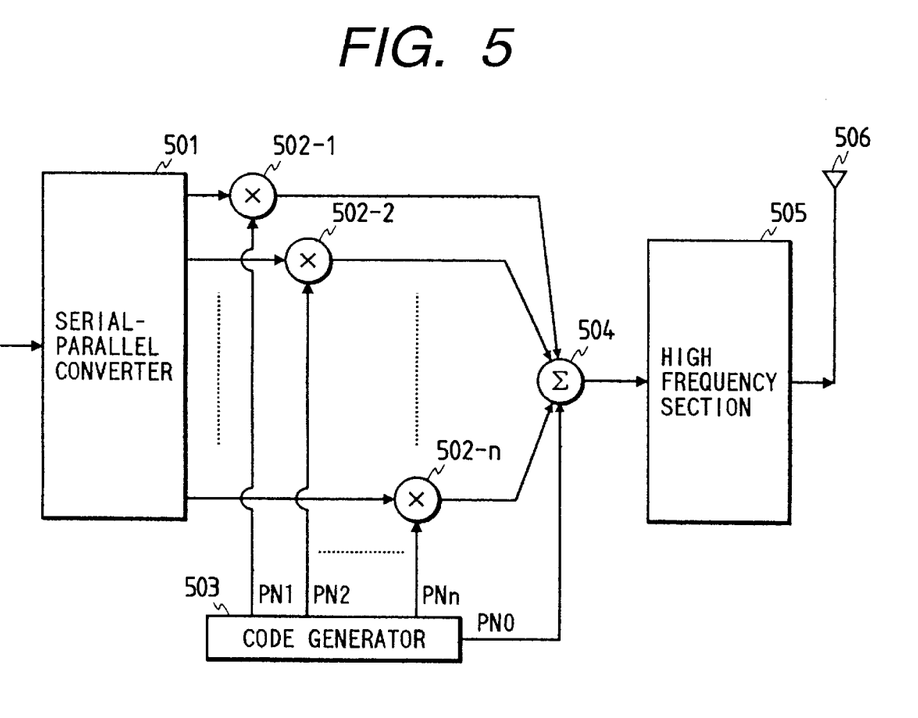
FIG. 5 is a block diagram showing a construction of a transmitter of a communication system of an embodiment 5 according to the invention.
Figure 6:
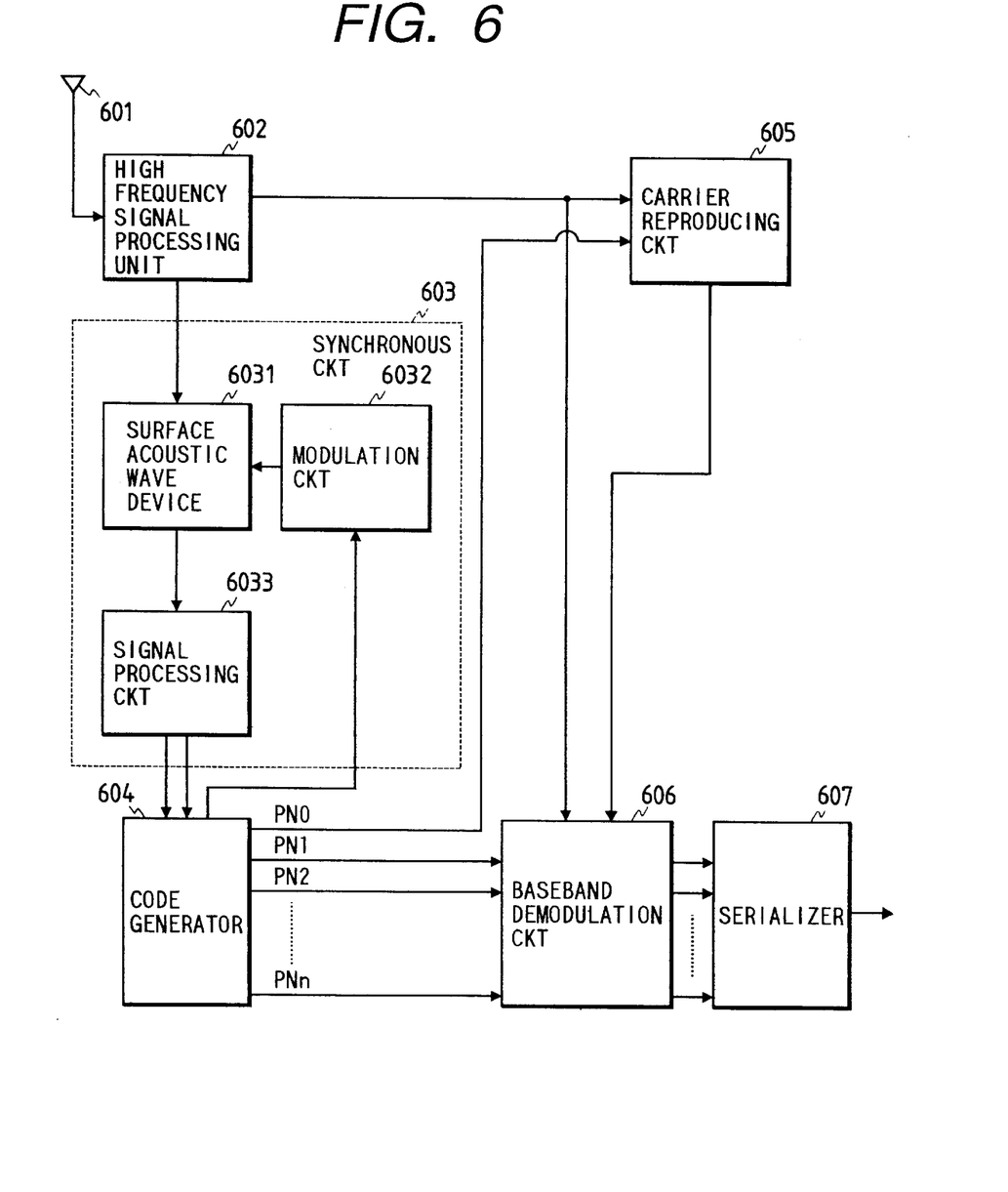
FIG. 6 is a block diagram showing a construction of a receiver of the communication system of an embodiment 5 according to the invention.

FIGS. 5 and 6 are block diagrams showing an example of the transmitter and receiver of the communication system using the surface acoustic wave converter and surface acoustic wave device as described above. In the transmitter shown in FIG. 5, reference numeral 501 denotes a serial-parallel converter for converting data that is serially inputted into n parallel data; 503 denotes a (diffusion) code generator for generating n different diffusion codes PN1 to PNn and a synchronization exclusive-use diffusion code PN0; 502-1 to 502-n denote a group of multipliers for multiplying the parallel data and the n diffusion codes PN1 to PNn which are generated from the diffusion code generator 503; 504 denotes an adder for adding the synchronization exclusive-use diffusion code PN0 which is generated from the diffusion code generator 503 and n outputs of the multipliers 502-1 to 502-n; 505 denotes a high frequency section to convert an output of the adder 504 into a transmission frequency signal; and 506 denotes a transmitting antenna.

In the receiver shown in FIG. 6, reference numeral 601 denotes a receiving antenna; 602 denotes a high frequency signal processing unit; 603 denotes a synchronous circuit for capturing a synchronization for the diffusion code and clock on the transmitting side and for maintaining; 604 a (diffusion) code generator for generating the same (n+1) diffusion codes PN1 to PNn and reference diffusion code PN0 as the diffusion code group on the transmitting side by a code sync signal and a clock signal which are inputted from the synchronous circuit 603; 605 denotes a carrier reproducing circuit for reproducing a carrier signal from the carrier reproducing diffusion code PN0 which is generated from the code generator 604 and an output of the high frequency signal processing unit 602; 606 denotes a baseband demodulation circuit for performing a demodulation in a baseband by using an output of the carrier reproducing circuit 605, an output of the high frequency signal processing unit 602, and the n diffusion codes PN1 to PNn as outputs of the code generator 604; and 607 denotes a serializer for converting n parallel demodulation data as outputs of the baseband demodulation circuit 606 into serial data.

In the above construction, on the transmitting side, the inputted data is first converted into n parallel data of the number equal to the code division multiplex number by the serial-parallel converter 501. On the other hand, the code generator 503 generates the (n+1) different diffusion codes PN0 to PNn of the same code period. Among them, the diffusion code PN0 is used only for synchronization and carrier reproduction and is directly inputted to the adder 504 without being modulated by the parallel data. The remaining n diffusion codes PN1 to PNn are multiplied with the n parallel data by the multipliers 502-1 to 502-n and are modulated and are inputted to the adder 504. The adder 504 linearly adds the (n+1) signals inputted and outputs an added baseband signal to the high frequency section 505. The baseband signal is subsequently converted into a high frequency signal having a proper center frequency by the high frequency section 505 and is transmitted from the transmitting antenna 506.

On the receiving side, the signal received by the receiving antenna 601 is properly filtered and amplified by the high frequency signal processing unit 602 and is outputted as a transmitting frequency band signal or is converted into a proper intermediate frequency band signal and is outputted. The output signal is inputted to the synchronous circuit 603. The synchronous circuit 603 is constructed by: a surface acoustic wave device 6031 disclosed in the above embodiments of the invention; a modulation circuit 6032 for modulating the reference diffusion code which is inputted from the code generator 604; and a signal processing circuit 6033 for processing a signal which is outputted from the surface acoustic wave device 6031 and for outputting a diffusion code sync signal and a clock sync signal for the transmission signal to the code generator 604.

The surface acoustic wave apparatus described in the third embodiment is used as a surface acoustic wave device 6031. An output signal from the high frequency signal processing unit 602 and an output signal from the modulation circuit 6032 are inputted to the surface acoustic wave device 6031 and a convolution arithmetic operation of two input signals is executed. Now, assuming that the reference diffusion code PN0 which is inputted from the code generator 604 to the modulation circuit 6032 is a code obtained by time inverting the synchronization exclusive-use diffusion code which is transmitted from the transmitting side, in the surface acoustic wave device 6031, when the synchronization exclusive-use diffusion code component and the reference diffusion code included in the reception signal coincide on the waveguide of the surface acoustic wave device 6031, a correlation peak is outputted. In the signal processing circuit 6033, the correlation peak is detected from the signal which is inputted from the surface acoustic wave device 6031, a deviation amount of the code synchronization is calculated from a time required from the start of the reference diffusion code PN0 to the generation of the correlation peak, and the code sync signal and the clock signal are outputted to the code generator 604. After the synchronization was established by what is called a loop circuit mentioned above, the code generator 604 generates the diffusion code group PN0 to PNn in which the clocks and diffusion code phases coincide with those of the diffusion code group on the transmitting side.

A convolution output of a high power can be obtained by the surface acoustic wave device 6031 according to the invention. When the deviation amount of the code synchronization is calculated from the time required from the start of the reference diffusion code PN0 to the generation of the correlation peak, since the output level of the correlation peak and the phase are clear, a converging time in case of getting the synchronization can be reduced and the accurate demodulation can be performed.

Among the code group as outputs of the code generator 604, the synchronization exclusive-use diffusion code PN0 is inputted to the carrier reproducing circuit 605. In the carrier reproducing circuit 605, the reception signal converted into a transmitting frequency band or intermediate frequency band as an output of the high frequency signal processing unit 602 is inversely diffused by the synchronization exclusive-use diffusion code PN0, thereby reproducing a carrier in a transmitting frequency band or intermediate frequency band. As a construction of the carrier reproducing circuit 605, for example, a circuit using a phase locked loop is used. The reception signal and the synchronization exclusive-use diffusion code PN0 are multiplied by the multiplier. After the synchronization was established, the clock and code phase of the synchronization exclusive-use diffusion code PN0 in the reception signal and those of the synchronization exclusive-use diffusion code PN0 for reference coincide. Since the synchronization exclusive-use diffusion code PN0 on the transmitting side is not modulated by the data, it is inversely diffused by the multiplier and a carrier component appears as its output. The output is subsequently inputted to a band pass filter and only the carrier component is extracted and outputted. The output is subsequently inputted to a well-known phase locked loop constructed by a phase detector, a loop filter, and a voltage controlled oscillator. A signal which is phase locked to a carrier component that is outputted from the band pass filter by the voltage controlled oscillator is outputted as a reproduction carrier.

The carrier reproduced by the carrier reproducing circuit 605 is inputted to the baseband demodulation circuit 606. In the baseband demodulation circuit 606, a baseband signal is formed from a reproduction carrier of the carrier reproducing circuit 605 and the output of the high frequency signal processing unit 602. The baseband signal is distributed to n signals. The signals are inversely diffused every code dividing channel by the diffusion codes PN1 to PNn as outputs of the code generator 604. Subsequently, the data is demodulated. The n parallel demodulated data are converted into the serial data by the serializer 607. The serial data is outputted.

In the embodiment, since the surface acoustic wave device having therein the surface acoustic wave converter according to the invention is used, a convolution efficiency in the synchronous circuit 603 can be raised. A time to establish the synchronization is reduced. A certain sync signal can be obtained. A large advantage can be derived.

Although the embodiment has been described with respect to the case of the binary modulation, the invention can be also applied to another modulating method such as an orthogonal modulation or the like.

According to the invention as described above, the signal having the time delay which is determined by the position of the IDT is given to each IDT constructing the surface acoustic wave converter, so that the surface acoustic wave converter having a good unidirectional performance in a wide frequency range can be realized.

By applying such a surface acoustic wave converter to the surface acoustic wave device to obtain the convolution signal as a convolver, a convolution output signal at the high level is obtained and an influence by the reflection waves of the surface acoustic waves can be reduced.

Further, by using the surface acoustic wave device into the communication system, a demodulation signal of a high reliability can be obtained. Particularly, the convolution signal having a correlation peak at the high level can be obtained in the spread spectrum (SS) communication system from the high frequency signal thereof and the signal obtained by modulating the reference diffusion signal from the code generator.

What is claimed is:

1. A surface acoustic wave converter which is formed on a piezoelectric substrate, comprising:

an interdigital transducer, arranged on said piezoelectric substrate, for converting an electric signal into surface acoustic waves, wherein said interdigital transducer has first and second electrode groups each having one or several pair of electrode fingers to which a first signal is almost simultaneously inputted;

first input means for inputting said first signal to said one or several pair of electrode fingers of said first electrode group; and second input means for inputting said first signal to said one or several pair of electrode fingers of said second electrode group when at least one of surface acoustic waves excited by said first signal in said one or several pair of electrode fingers of said first electrode group reaches one of said one or several pair of electrode fingers of said second electrode group, said second input means comprising a delay circuit which delays said first signal by a predetermined time and inputs the delayed first signal to said second electrode group, said predetermined time being equivalent to a time taken for the surface acoustic wave excited in said first electrode group to reach said second electrode group.

2. A converter according to claim 1, wherein the number of said one or more electrode fingers is equal to n, a positional relation among said n electrode fingers in each of said first and second electrode groups is the same, a distance between the centers of said first and second electrode groups is equal to $m\lambda$, and said second input means inputs a signal which was delayed by $kT$ than the signal inputted to said first electrode group by said first input means to said second electrode group, where, n: integer of 1 or more m: integer or semi-integer of n or more $\lambda$: wavelength at a center frequency of a surface acoustic wave which is excited by said interdigital transducer k: integer or semi-integer which is equal to or larger than 1 and is equal to or smaller than m T: period at a center frequency of a surface acoustic wave which is excited by said interdigital transducer.

3. A converter according to claim 2, wherein said k and m are equal.

4. A converter according to claim 1, wherein the number of said one or more electrode fingers is equal to n, a positional relation among said n electrode fingers in each of said first and second electrode groups is the same, a distance between the centers of said first and second electrode groups is equal to $(m+\frac{1}{4})\lambda$, and said second input means inputs a signal which was delayed by $(k+\frac{1}{4})T$ than the signal inputted to said first electrode group by said first input means to said second electrode group, where, n: integer of 1 or more m: integer or semi-integer of n or more $\lambda$: wavelength at a center frequency of a surface acoustic wave which is excited by said interdigital transducer k: integer or semi-integer which is equal to or larger than 1 and is equal to or smaller than m T: period at a center frequency of a surface acoustic wave which is excited by said interdigital transducer.

5. A converter according to claim 4, wherein said k and m are equal.

6. A converter according to claim 1, wherein said first and second electrode groups have a reference electrode for giving an electric potential serving as a reference for the inputted signal.

7. A converter according to claim 6, wherein when the number of said one or more electrode fingers is equal to or larger than 2, said reference electrode is arranged between said two or more electrode fingers.

8. A converter according to claim 6, wherein said reference electrode is arranged between said first and second electrode groups.

9. A converter according to claim 8, wherein said reference electrode is arranged in a miunderline shape.

10. A converter according to claim 1, wherein said electric signal which is inputted to said interdigital transducer is a phase modulated signal.

* * * * *

UNITED STATES PATENT AND TRADEMARK OFFICE
CERTIFICATE OF CORRECTION

PATENT NO. : 6,020,672

DATED : February 1, 2000

INVENTOR(S): AKANE YOKOTA, ET AL.  Page 1 of 2

It is certified that error appears in the above-identified patent and that said Letters Patent is hereby corrected as shown below:

COVER PAGE AT ITEM [57] ABSTRACT:
Line 7, "includes" should read --include--.

COLUMN 2:
Line 8, "don't" should read --do not--.

COLUMN 5:
Line 22, "a" should read --an--.

COLUMN 6:
Line 35, "be tween" should read --between--; and
Line 40, "propagates" should read --propagate--.

COLUMN 7:
Line 57, ":signal" should read --signal--.

COLUMN 8:
Line 4, "doesn't" should read --does not--.

UNITED STATES PATENT AND TRADEMARK OFFICE
CERTIFICATE OF CORRECTION

PATENT NO. : 6,020,672

DATED : February 1, 2000

INVENTOR(S): AKANE YOKOTA, ET AL.

It is certified that error appears in the above-identified patent and that said Letters Patent is hereby corrected as shown below:

COLUMN 10:
Line 14, "Is" should read --is--.

Signed and Sealed this

Twenty-seventh Day of March, 2001

NICHOLAS P. GODICI

Attest:

Attesting Officer

Acting Director of the United States Patent and Trademark Office